United States Patent

[11] 3,617,916

[72] Inventor Leland B. Smith
Whittier, Calif.
[21] Appl. No. 848,396
[22] Filed July 24, 1969
[45] Patented Nov. 2, 1971
[73] Assignee Beckman Instruments, Inc.
Continuation of application Ser. No. 581,040, Sept. 21, 1966, now abandoned. This application July 24, 1969, Ser. No. 848,396

[54] COMMUTATED BUFFER AMPLIFIER
10 Claims, 5 Drawing Figs.

[52] U.S. Cl. 330/30, 330/24, 330/30 D, 307/242
[51] Int. Cl. H05f 3/68
[50] Field of Search 330/147, 30, 30 D, 51; 307/242, 243, 254

[56] References Cited
UNITED STATES PATENTS

| | | | |
|---|---|---|---|
| 3,213,290 | 10/1965 | Klein et al. | 307/223 |
| 3,241,078 | 10/1966 | Jones | 330/30 X |
| 3,289,094 | 11/1966 | Young | 330/30 X |
| 3,384,831 | 5/1968 | Khockenhauer | 330/51 |
| 3,446,989 | 5/1969 | Allen et al. | 307/254 X |
| 3,448,393 | 6/1969 | Rice, Jr. | 340/51 X |
| 3,449,741 | 6/1969 | Egerton, Jr. | 340/347 |

*Primary Examiner*—Nathan Kaufman
*Attorneys*—Robert J. Steinmeyer and Richard M. Jennings ABSTRACT: The invention discloses a new and improved muliplex system wherein each of a multiplicity of inputs are sequentially connected by a switched differential input amplifier stage to a common output amplifier stage. Each input stage is rendered operative and inoperative by a control circuit through which bias current to the input stage is either supplied or denied. The control circuit consists of a switched transistor current source connected to the emitters of a differentially connected pair of transistors comprising the input amplifier stage. The respective transistor collectors of all the input stages are connected in parallel to the common output amplifier stage. The common output stage is composed of a number of transistors connected to provide a differential input and a single ended output. Feedback may be provided from the single ended output to each of the multiple inputs by either an operational or potentiometric configuration. By reason of the switched transistor current source control circuit connected to the differential input stage and the feedback from the single ended output to the multiple inputs, a combined switching speed and amplifier accuracy are provided that heretofore were not possible.

INVENTOR.
LELAND B. SMITH

BY T E Kuhlajsen

ATTORNEY

INVENTOR.
LELAND B. SMITH

BY

ATTORNEY

COMMUTATED BUFFER AMPLIFIER

This is a Streamline Continuation of Ser. No. 581,040 filed Sept. 21, 1966, now abandoned.

This invention relates to an improved commutated buffer amplifier, and in particular, to such an amplifier in which commutation takes place within the forward portion of a feedback loop by alternately applying and removing the amplifier bias required for linear operation.

In the prior art, high-speed commutation for high-level multiplexing has been performed by various forms of switches having no amplification. One form of such multiplexing is an amplifier followed by a semiconductor gate or switch by which the amplifier is periodically switched to a common signal bus. Each channel to be multiplexed has such an amplifier and switch combination and all such channels connected to a common bus comprise a multiplex system.

Another form of high-speed multiplexing is the low-level-switching system. Usually a multiplicity of nonamplifying semiconductor switches or gates are connected to a common bus which is followed by a single common amplifier through which all the switched inputs are sequentially connected.

In either of the above forms, the switching or gating of the various inputs is provided by nonamplifying gates and with no feedback around such gates. Under these circumstances, it is necessary that an amplifier be provided to furnish the signal levels as required by the following connected apparatus. In addition the speeds at which the gates can be operated has proved to be limited by the inherent gate capacitances and associated charging and discharging time constants.

It is the purpose of this invention to provide a new and improved commutated buffer amplifier in which both the functions of amplification and switching are performed at speeds heretofore not possible.

A further purpose is to provide a new and improved commutated buffer amplifier having a multiplicity of input stages with outputs of the multiple input stages connected in parallel to a single common output stage, such connections providing the forward link of a multiplicity of feedback loops, thus providing for each input such switching speeds and amplifier accuracies heretofore not possible.

These and other objects are achieved by providing a commutated buffer amplifier in which a first stage is supplied by a series current source in its bias voltage path, which may be paralleled by additional stages with similar current sources, connecting the output of these stages in parallel, providing many inputs to a single amplifier.

The novel features which are believed to be characteristic of the invention are set forth with particularity in the appended claims. The invention and further objects and advantages thereof can best be understood by reference to the following description and accompanying drawings in which FIG. 1 is a schematic showing an equivalent circuit of the commutated buffer amplifier in accordance with the invention;

Figure 1:
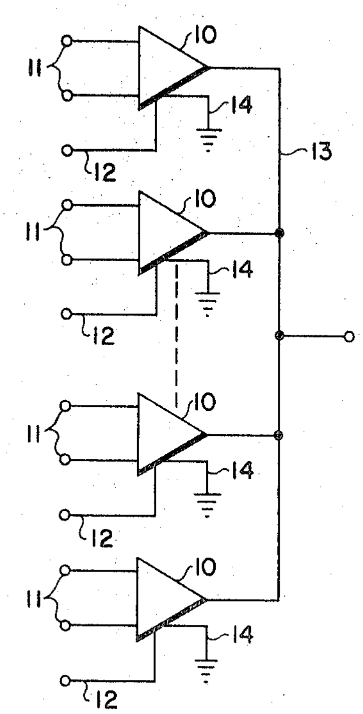

Turning now to the drawings, a generalized equivalent circuit is given in FIG. 1 employing a number of amplifiers 10, each having different input terminals 11 and drive control leads 12. The output of the amplifiers 10 are tied to a common output line 13. The other side of the output is grounded, as indicated by the ground leads 14. Each of the differential input leads is essentially independent of the others, allowing separate feedbacks from the common outputs to the various inputs to be used. The drive control 12 accompanies each input pair and provides the digitally driven controls which enable inhibit each input. The significance of this is that the input may be selected by turning on the appropriate current source, allowing commutation of the inputs to the amplifier. Such commutation has been achieved at accuracies of ±0.1-percent full scale and channel rates of $5\times10^6$ channels/second and operating rates at reduced accuracy up to $8\times10^6$ channels/second. As a typical example, a prior commutator has a maximum channel rate of $1.3\times10^5$ channels/second.

Figure 2:
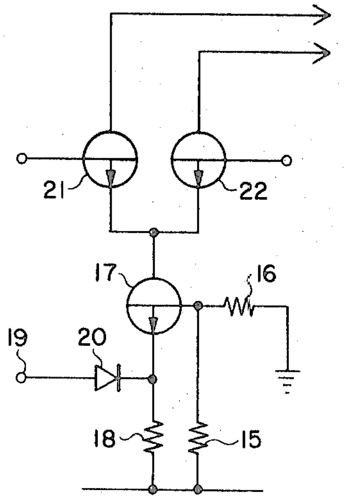
FIG. 2 is a circuit diagram of the input section of such a commutated amplifier.

In FIG. 2, the input section of a commutating amplifier is shown in more detail. Resistors 15 and 16 ($R_b$ and $R_b^1$ respectively) form a resistive divider which establishes a base potential for the current source transistor 17. Resistor 18 ($R_i$) establishes a fixed current in the current source 17. Current source 17 is driven as a common base transistor; however, the invention is not limited to this configuration. The reason for the use of the common base configuration is threefold; first, it has a higher cutoff frequency than a common emitter configuration; second, when the turnoff or inhibit drive is applied to the input terminal 19 and through the diode 20, which connects the enable and inhibit drive (not illustrated) to current source 17, the emitter-collector capacitance of the current source 17 couples the drive into the emitters of transistors 21 and 22 in such a way as to enhance turnoff. If the current source 17 were in the common emitter configuration, this would not be so. The collector base capacitances would then couple the drive so as to further turn on the transistors 21 and 22. The third reason will be discussed, together with a discussion of the transients which occur when the transistor 17 is turned on and off.

When an enable drive is applied to terminal 19, the diode 20 becomes reverse biased and transistor 17 turns on. The stored charge in the diode 20 helps to charge the emitter base junction capacity of transistor 17; that is, it charges the emitter transition capacity and establishes transistor action. Diode 20 also charges the collector to emitter capacity of transistor 17, the action of which will enhance the charging of the emitter transition capacity of transistors 21 and 22 so as to turn them on. The current in the collector of transistor 17 rises with a time constant which is a function of the gain bandwidth product of the transistor. The two transistors 21 and 22 also turn on with a time constant which is a function of their common emitter cutoff frequencies. If the gain bandwidth products of the three transistors are fairly well matched, the base current of transistors 21 and 22 will always remain small, since the common emitter current gain can be established quickly during turn on. If the gain bandwidth product of the current source 17 is less than that of transistors 21 and 22, the transient components of the base currents will be kept small. If the sources for the base currents are low impedances, then small transients will not be significant and speed will be the only concern. For these conditions, the highest possible gain bandwidth product should be used. The transients in the base currents of transistors 21 and 22 are derived from charging the emitter transition capacities to establish transistor action and from changes in potential across the collector base capacitances due to collector current changes, due in turn to bias current changes from current source to current source in the common mode and from differential voltage changes from responding to the input signal.

The charge required by the emitter transition capacity is simply the stored base charge, given by the equation $$Q_b=\tau_s I_c/\beta \qquad (1)$$

where $\tau_s$ is the storage time in the base region of a transistor, $\beta$ is the common emitter current gain and $I_c$ is the collector current, and the charge required by the collector base capacitances is given by equation $$Q=C_{ob}[\Delta E_{cm}+\Delta E \text{ diff.}/2] \qquad (2)$$

where $C_{ob}$ is the collector base capacitance, $\Delta E_{cm}$ is the change in the common mode voltage and $\Delta E$ diff. is the change in the differential mode voltage. The time element in the establishment of these charge equilibriums determines the magnitude and time constants of the base current transients in transistors 21 and 22. This time element discussion will be discussed further, together with that of the overall amplifier response, since expressions for the change in the common mode and differential mode voltages will be established.

Figure 3:
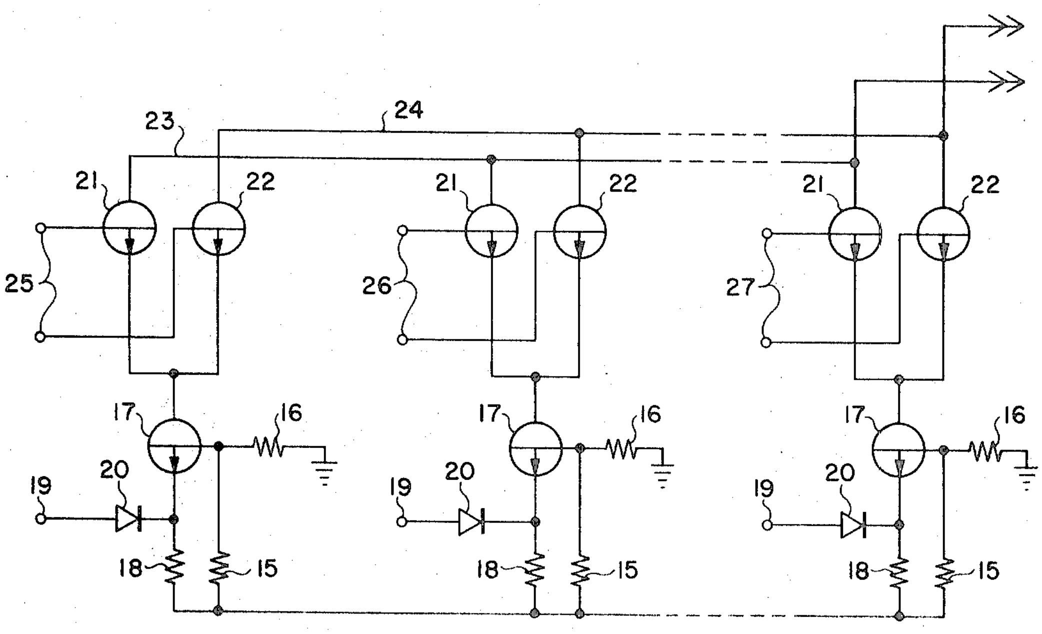
FIG. 3 is a circuit diagram illustrating multiple input sections.

For a multichannel capacity amplifier, the first stage of the amplifier is illustrated in FIG. 3. The input section, shown singly in FIG. 2 and multiply in FIG. 3, is used for the first amplification stage and input of a servoamplifier. Similar numerals are used to designate components of FIG. 3 which are the same as those illustrated in FIG. 2. In addition, the collectors of the transistors 21 are tied together to a common output line 23, and those of transistors 22 are tied together to a common output line 24. Lines 23 and 24 go to the output stage of the complete amplifier. Separate analog differential inputs are applied to the terminals 25, 26 and 27.

Figure 4:
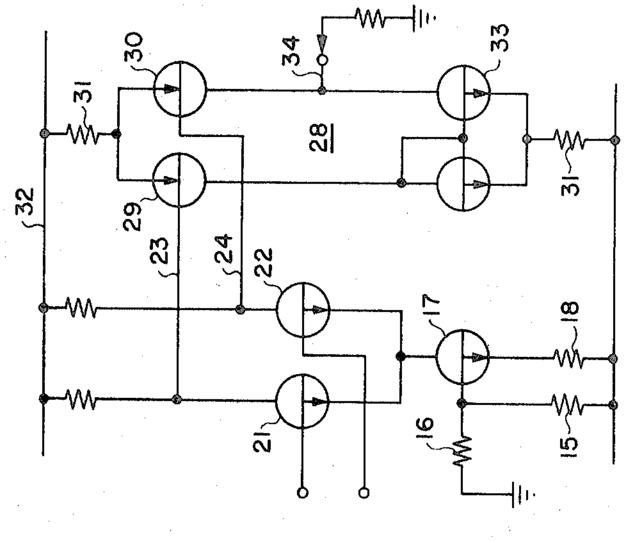
FIG. 4 is a circuit diagram illustrating a forward link with both the input section and output stage.

The general and specific discussion of the buffer amplifier will be carried out first in the terms of an amplifier without commutation features, and then the behavior of the amplifier performing commutation will be discussed. A general schematic of the amplifier required to show the DC bias conditions and general behavior is given in FIG. 4. The voltage gain stages are shown for the forward link of the servoamplifier of a buffer amplifier. The output leads 23 and 24, again using the same numerals for similar parts as illustrated in FIGS. 1–3, drives a complementary symmetry emitter-follower output stage 28 for buffer duty. Transistor 17 and resistors 15, 16 and 18 perform the functions of providing a current source for the first gain stage transistors 21 and 22. The differential voltage gain of the first stage is given by the equation $$Av_{1_{DC}} \cong \frac{R_L}{\frac{26(mv)}{I_E(ma)}+r_a} \qquad (3)$$

where:

$$26(mv)=KT/Q$$

$K$=Boltzmann's constant.

$T$=Absolute Temp. (300°).

$Q$=Unit charge constant in Coulombs.

$R_L$=The loaded collector resistance of transistors 21 and 22.

$r_a$=All the intrinsic gain-degenerating resistance of transistors 21 and 22 exclusive of $r_e$, the intrinsic emitter resistance which is 26 mv/$I_E$, and $I_E$=The emitter current of transistors 21 and 22.

The collector voltage $E_C$ is established by $I_E$ and $R_L$. The voltage $E_C$ is given by the equation $$E_C=I_E R_L \qquad (4)$$

$E_C$ and resistance $R_E$ determine the current in the differential stage, employing transistors 29 and 30, where $R_E$ is the resistance of resistor 31 connected from the emitters of transistors 29 and 30 to the plus voltage line 32. The current in the collector of transistor 29 is inverted by transistor 33, producing a current sink for the collector current of transistor 30. With no differential signal applied to the input and with the differential components of the stages balanced, no current flows in the output lead 34. If $E_C$ changes in a common mode manner, the magnitude of the current in the collectors of transistors 30 and 33 changes, but remains identical, that is, remains nulled.

The differential voltage gain of the second stage 28 is the same as for a stage with differential input and differential output. The gain of transistor 29 is phase-inverted and added to the gain of transistor 30 and produces a single-ended output with all the stability characteristics of a true differential amplifier. The expression for the voltage gain of the second stage 28 is given by the equation $$Av_{2_{DC}} \cong \frac{R_{L_2}}{\frac{26mv}{I_{e_2}}+r_b} \qquad (5)$$

where $r_b$=all intrinsic degenerating resistances in the differential emitter circuit;

$R_{L_2}$=the load resistor connected to lead 34;

$I_{e_2}$=the emitter current of transistors 29 and 30.

Figure 5:
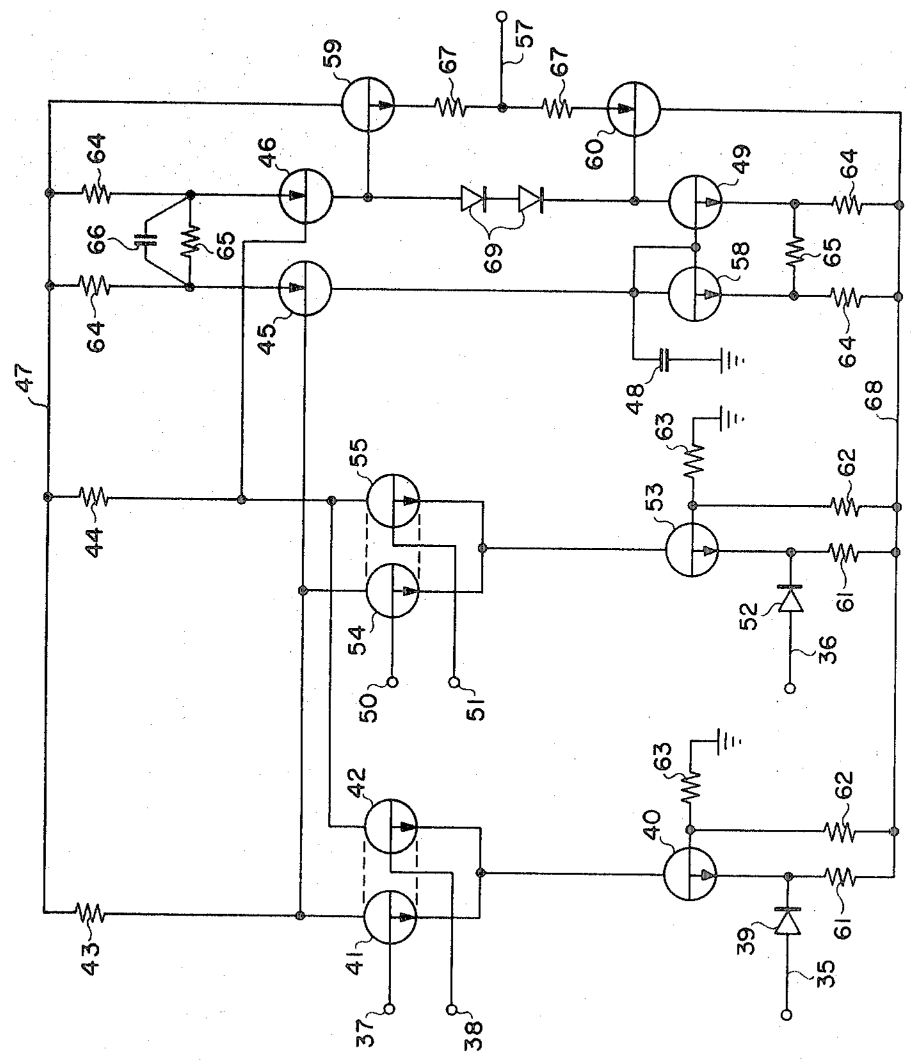
FIG. 5 is a circuit diagram of a two-channel commutating buffer amplifier in accordance with the invention.

A two-channel commutating buffer amplifier will now be discussed. The schematic of such an amplifier is shown in FIG. 5. The amplifier, when used with only one input stage and with the current source replaced by a resistor, was previously designed for use in a high-speed digitizer for operational feedback and exhibits settling times to a step input of 120 to 180 nanoseconds.

Consider the amplifier of FIG. 5 with enable and inhibit drive 35 enabled, enable and inhibit drive 36 inhibited, and with the amplifier settled to a steady state signal on differential input terminals 37 and 38. At time $t_o$, the enable and inhibit drive 35 is inhibited with a signal having a rise time of $\Delta t_t$ and amplitude $E$ volts. The drive-coupling diode 39 will become forward biased when the drive rises to −4 volts, for example. (The figures used here will be those applicable in connection with a circuit in accordance with the table of components listed for the elements of FIG. 5 hereinafter.) The drive is a low-impedance source which supplies any current necessary to drive the capacities in the circuit. The drive neutralizes the base-stored charge and causes a current to flow through the collector-emitter capacitance of the current source 40. The current through the collector-emitter capacitance is in opposition to the polarity of the collector current, causing the collector current $I_C$ to decrease more rapidly than if left to the circuit parameters. If the current through the collector emitter capacitance is larger than $I_C$, the excess current discharges the emitter transition capacity of the transistors 41 and 42. The drive amplitude and rise time can be used to cause a decrease in turnoff time of the current source 40 and transistors 41 and 42. If the effect of the drive is too large it will cancel $I_C$, neutralizing the emitter transition capacity in transistors 41 and 42 and coupling the extra current into the base circuits of transistors 41 and 42. The current coupled through the collector-emitter capacity of the current source 40 is given by the equation $$i=C_{CE}\frac{\Delta E\ \text{drive}}{\Delta t_t} \qquad (6)$$

where $C_{CE}$=the collector emitter capacitance;

$\Delta E$ drive=the inhibit drive voltage swing after current source turnoff; and $\Delta T_t$=the rise time for the inhibit drive.

Where $i > I_C$, the charge available to charge the emitter transition capacity $C_{TE}$ of transistors 41 and 42 is $$Q=(i-I_C)\Delta t_t \qquad (7)$$

With the transistors 41 and 42 turned off, the collector resistors 43 and 44 ($R_l$) charge the collector base capacities of transistors 41, 42, 45 and 46 from the plus voltage supply line 47; that is, base voltages of transistors 45 and 46 charge positively with the time constant $\Upsilon_1$ in accordance with the following equation:

$$\tau_1=\frac{R_1}{2}\,(2NC_{ob_{1,2}}+2C_{ob_{3,4}}) \qquad (8)$$

where

N=the number of channels available;

$C_{ob_{1,2}}$=the collector base capacities of transistors 41 and 42, and $C_{ob_{3,4}}$=the collector base capacities of transistors 45 and 46.

This causes the collector current in transistors 45 and 46 to decrease. Capacitor 48 ($C_1$) holds the base voltage on transistor 49 discharging negatively with the time constant $\Upsilon_2$ where $$\Upsilon_2=R_2C_1 \qquad (9)$$

where $R_2$=resistor 64.

Time constant $\Upsilon_2$ will usually be two orders of magnitude longer than time constant $\Upsilon_1$. This holds the collector current of transistor 49 essentially constant, causing the output to fall negatively. If a new channel is not enabled, the amplifier will turn off. For normal operation in commutator service, no more than 20 to 50 nanoseconds should elapse from time-inhibit to time-enable.

Consider the analog differential input employing terminals 50 and 51 tied to a channel different from that which drives the analog differential input on terminals 37 and 38. Consider also that the channel, including the transistors 41 and 42, has been inhibited for a time $t_2$. The collector potential on the first stage will have charged positively $\delta E_C$ given by $$\Delta E_C = (E - E_C)(1 - e^{-\Delta t_2/\tau_1}) \quad (10)$$

where $E$=the voltage of the positive supply on line 47. The collector current in transistors 45 and 46 will have fallen $\delta I_C$ given by $$\delta I_C = \delta E_c / R_2 \quad (11)$$

and the collector current in transistor 49 will have fallen by $\delta I_C^1$ given by $$\Delta I_C^1 = \frac{E_b}{R_2}(1 - e^{-\Delta t_2/\tau_2}) \quad (12)$$

Where $E_b$=the base voltage of transistor 49. The net imbalance in the collector currents of transistors 46 and 49 would then be equation (11) minus equation (12) or $$\Delta I_C - \Delta I_C^1 = \frac{E - E_c}{R_2}(1 - e^{-\Delta t_2/\tau_1}) - \frac{E_b}{R_2}(1 - e^{-\Delta t_2/\tau_2}) \quad (13)$$

After the passage of time $t_2$, an enable drive enables the second channel in input terminal 36, reverse biasing the drive-coupling diode 52. The charge stored in the diode 52 junction is transferred to the emitter base junction of transistor 53, aiding its turn-on. Collector current in transistor 53 rises with a time which is a function of its gain bandwidth product. The rising collector current in transistor 53 charges the emitter transition capacity of transistors 54 and 55, turning them on. With feedback around the entire amplifier, the output of the amplifier on terminal 57 and the analog input on terminals 50 and 51 establish a differential error signal across the bases of transistors 54 and 55. If the error signal is larger than $2V_{bE}$, only one side of the differential stage turns on initially. The common mode bias is reestablished with time constants $\approx \Upsilon_1$ and $\Upsilon_2$ given in equations (8) and (9). The output of the amplifier settles to a new channel with similar characteristics to an amplifier responding to a step input signal. The preestablishment of the error signal enhances the settling time, allowing the amplifier to settle from commutation faster than it can from a step input.

Typical examples of components which may be used to construct the circuit of FIG. 5 are as follows:

Transistors:
- 40, 49, 53, 58, 59—2N3563
- 41–42 and 54–55—UX500-3951X Fairchild pairs*
- 45, 46, 60—3640-2N Diodes:
- 39, 50—FD829
- 68—HB869(Hughes)* *The Fairchild and Hughes transistors are obtainable from Fairchild Semiconductor Corp. 313 Fairchild Drive, Mountain View, California and Hughes Semiconductor Division, 690 North Sepulveda Boulevard, El Segundo, California.

Resistors:
- 43, 44—3,000 ohms
- 61—2,000 ohms
- 62—8,200 ohms
- 63—3,300 ohms
- 64—1,100 ohms
- 65—2,200 ohms
- 66—10 ohms Capacitors:
- 48—100 picofarads
- 65—15 picofarads Voltages on lines:
- 47 is +12 volts.
- 67 is −12 volts.

Since the principles of the invention have now been made clear, modifications which are particularly adapted for specific situations without departing from those principles will be apparent to those skilled in the art. The above circuit may obviously be modified by replacing the differential pair such as transistors 21 and 22 with a single-ended input which might employ a field effect device, for example.

I claim:

1. A commutated buffer amplifier for selectively producing an output signal in response to any one of a plurality of input signals comprising:

a plurality of differential input amplifier stages having a common pair of output terminals, each stage having a common terminal and a pair of input terminals;

a switched constant current source connected to the common terminal of each of said amplifier stages for supplying a constant current bias to any one of said amplifier stages thereby rendering said stage active and all other stages inactive; and a switching circuit connected to said switched current source for selectively switching said constant current source to supply said bias current to a selected one of said input amplifier stages, said switching circuit being connected to said switched constant current source in a manner such that inherent circuit capacitance couples additional current into said common terminal which current aids in rendering each of said stages active and inactive.

2. A commutated buffer amplifier comprising:

a plurality of input stages each comprising a differentially connected transistor pair having one pair of like output electrodes connected in parallel with the pair of output electrodes of each and every other input stage, a second pair of like common electrodes connected together and a third pair of like input electrodes each connected to an input terminal for receiving an input voltage;

switched current source means having a plurality of switching signal input terminals, a switching signal reference terminal and a plurality of current output terminals, each one of said plurality of current output terminals being exclusively connected to the common electrodes of only one of said plurality of input stages, said switched current source means coupling a predetermined constant bias current to a selected one of said input stages to render said stage active in response to a control signal at a selected one of said switching signal input terminals, the current which flows through said selected one of said input stages being independent of any input voltage applied to the input terminals of said selected one of said input stages, said switched current source means having capacitance between said selected one of said switching signal terminals and one of said current output terminals providing additional current to enhance the rapidity with which said selected one of said input stages is rendered active and inactive.

3. The commutated buffer amplifier defined in claim 2 wherein said switched current source means is a plurality of transistors each connected as a fixed current source when rendered active and as a nonconducting path when inactive, each of said switching signal input terminals being the emitter of said transistors, each of said switching signal reference terminals being the base of said transistors and each of said current output terminals being one of the collectors of said transistors.

4. The commutated buffer amplifier defined in claim 3 wherein said fixed current source further comprises:

a resistor divider circuit adapted to be connected across a bias voltage and having its center connected to the base of one of said plurality of transistors;

a resistor connected from one end of said resistor divider circuit to the emitter of said one of said plurality of transistors for establishing a fixed current therein; and a drive coupling diode having one end connected to the emitter of said one of said plurality of transistors and the other end adapted to receive enable and inhibit signals.

5. The commutated buffer amplifier defined in claim 2 wherein said one pair of like output electrodes are collectors, said second pair of like common electrodes are emitters and said third pair of like input electrodes are bases.

6. The commutated buffer amplifier defined in claim 10 wherein said second impedance means includes at least one diode.

7. The commutated buffer amplifier of claim 10 in which said output stage is a complementary symmetry emitter-follower stage.

8. The commutated buffer amplifier defined in claim 10 further comprising a plurality of feedback resistors each connected from the output terminal of said output stage to one of said pair of input electrodes of each of said input stages to provide a negative feedback path to each stage as it is rendered active.

9. A commutated buffer amplifier comprising:

a plurality of input stages each including a differentially connected first transistor pair with the collectors connected in parallel with the collectors of each and every other input stage to form a common pair of output electrodes, the pair of emitters connected together as a common electrode and the bases connected as a pair of differential input electrodes;

a plurality of switched current sources each having a switching signal input terminal, a switching signal reference terminal and a current output terminal, each current output terminal being connected to the common electrode of one first transistor pair, a selected one of said switched current sources coupling a predetermined constant bias current to said one first transistor pair in response to a control signal at a selected one of said switching signal input terminals, said constant bias current being independent of any signal applied to said one first transistor pair, each one of said switched current sources having capacitance between said switching signal terminal and said current output terminal providing additional current to enhance the rapidity with which said one transistor pair is rendered operative and inoperative;

a second transistor pair of a first conductivity type opposite to said first transistor pair and having their bases connected as input terminals to the parallel connected collectors of said input stages;

a first impedance means interconnecting the emitters of said second transistor pair and connecting them to a first voltage bias terminal;

a third transistor pair of a second conductivity type the same as said first transistor pair, one of said third transistor pair having its collector connected directly to the collector of one of said second transistor pair;

a second impedance means interconnecting the other collector of said third transistor pair to the collector of the other of said second transistor pair;

means directly connecting the bases of said third transistor pair with the collector of one of said third transistor pair, and connecting them through a capacitor to ground;

third impedance means interconnecting the emitters of said third transistor pair and connecting them to a second voltage bias terminal;

a first output transistor of said second conductivity type having its collector connected to said first voltage bias terminal, its base connected to the collector of said other of said second transistor pair and its emitter connected through a resistor to an output terminal; and, a second output transistor of said first conductivity type having its collector connected to said second voltage bias terminal, its base connected to the collector of said other of said third transistor pair and its emitter connected to a resistor to said output terminal.

10. A commutated buffer amplifier comprising:

a plurality of input stages each comprising a differentially connected transistor pair having a pair of collector electrodes connected in parallel with the pair of collector electrodes of each and every other input stage, a second pair of emitter electrodes connected together and a third pair of base electrodes each connected to an input terminal for receiving an input voltage;

switched current source means having a plurality of switching signal input terminals, a switching signal reference terminal and a plurality of current output terminals, each one of said plurality of current output terminals being exclusively connected to the emitter electrodes of only one of said plurality of input stages, said switched current source means coupling a predetermined constant bias current to a selected one of said input stages to render said stage active in response to a control signal at a selected one of said switching signal input terminals, the current which flows through said selected one of said input stages being independent of any input voltage applied to the input terminals of said selected one of said input stages, said switched current source means having capacitance between said selected one of said switching signal terminals and one of said current output terminals providing additional current to enhance the rapidity with which said selected one of said input stages is rendered active and inactive;

a first pair of transistors of a first conductivity type opposite to the transistor pairs of said input stages having their bases connected as input terminals to the parallel connected collectors of said input stage pairs;

first impedance means interconnecting the emitters of said first pair of transistors and connecting said emitters to a first voltage bias terminal;

a second pair of transistors of a second conductivity type the same as said input stage pairs, one of said second pair having its collector connected directly to the collector of one of said first pair of transistors;

second impedance means interconnecting the other collector of said second pair of transistors to the collector of the other of said first pair of transistors;

means directly connecting the bases of said second pair of transistors with the collector of one of said second pair and through a capacitor to ground;

third impedance means interconnecting the emitters of said second pair of transistors and connecting them to a second voltage bias terminal;

a first output transistor of said second conductivity type having its collector connected to said first voltage bias terminal, its base connected to the collector of said other of said first pair and its emitter connected through a resistor to an output terminal; and a second output transistor of said first conductivity type having its collector connected to said second voltage bias terminal, its base connected to the collector of said other of said second pair and its emitter connected through a resistor to said output terminal.

* * * * *